United States Patent
Elamanchili et al.

(10) Patent No.: US 6,456,110 B1
(45) Date of Patent: Sep. 24, 2002

(54) VOLTAGE LEVEL SHIFTER HAVING ZERO DC CURRENT AND STATE RETENTION IN DROWSY MODE

(75) Inventors: Pradeep Elamanchili; Eric J. Hoffman, both of Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/750,110

(22) Filed: Dec. 29, 2000

(51) Int. Cl.[7] .......................................... H03K 19/0175
(52) U.S. Cl. .......................................... 326/68; 326/80
(58) Field of Search .............................. 326/68, 80, 81, 326/82, 83, 86–87, 112, 119, 121

(56) References Cited

U.S. PATENT DOCUMENTS 5,614,847 A * 3/1997 Kawahara et al. ............. 326/98
6,246,265 B1 * 6/2001 Ogawa ......................... 326/95

* cited by examiner

Primary Examiner—Michael Tokar
Assistant Examiner—James H Cho
(74) Attorney, Agent, or Firm—Antonelli, Terry, Stout & Kraus, LLP

(57) ABSTRACT

A voltage level shifter for changing digital bit levels between devices having different voltage levels. In addition to changing the voltage levels in the normal mode, the device includes additional transistors which are activated when the system is in a drowsy mode so as to cut DC current drain and to latch outputs to ignore extraneous inputs.

14 Claims, 2 Drawing Sheets

VOLTAGE LEVEL SHIFTER HAVING ZERO DC CURRENT AND STATE RETENTION IN DROWSY MODE

FIELD

The present invention is related to a voltage level shifter and more particularly to a voltage level shifter having a zero DC current and state retention when in the drowsy mode.

BACKGROUND

Electronic devices of all sorts are now used in many aspects of peoples lives, both at home and in the workplace. Digital devices in particular are becoming more and more common and are used in all sorts of equipment. Integrated circuits are used not only with computer equipment but also in other electronic system. Earlier types of digital equipment using integrated circuits have used specific voltage levels such as 3.3 volts. However, for a number of reasons it is desirable to lower the voltage level used in such equipment.

In some cases, it is desirable to use a lower voltage merely to lower the amount of heat generated and in general as part of power conservation. However, the situation is even more important as portable equipment becomes more common which relies on batteries for power. Thus, it is no longer merely a question of generally reducing power output, but instead it relates directly to the portability of the device since smaller more portable batteries could be used if the power requirements were small enough. In particular, in equipment such as cellular telephones the use of smaller batteries is very important since the size of the battery will be a large factor in determining the size and weight of the telephone. Likewise, in laptop computers and other similar portable computing devices, the size and weight of the battery is an important consideration in regard to the size and weight of the overall device.

For these reasons, it is desirable to use a lower voltage level than previously. Thus, instead of using a 3.3 volt signal to indicate a digital "1", a voltage level of 1.1. volt may be used in many cases for the same digital "1". However, this change has not occurred in all equipment. Thus, it sometimes happens that while the microprocessor in a system has a reduced voltage, other peripheral devices such as the memory modules may not yet have been redesigned. Accordingly, it is necessary to have different voltage levels in different parts of a system. In order to do this voltage level shifters are used when going from a higher voltage area to a lower voltage area.

In addition to lowering the voltage level overall in a device, other techniques have also been used to lower the power operation in certain devices. New modes of operation have been incorporated into some devices so as to reduce power usage when the device is not in full operation. Thus, a so-called "sleep mode" has been utilized where power is shut off to entire devices when they are not in operation. A less drastic step is also sometimes used called a "drowsy mode" where the power supply is still on but the voltage is reduced so that the difference between the "1" voltage level and the "0" voltage level is smaller than it would be in normal operation. However, the use of these different modes of operation can cause difficulty in the manner in which the level shifters work. Thus, it is critical that the voltage level shifters retain the proper state of the signals, that is, that extraneous signals which may occur during the drowsy mode are ignored. Also it is important that there is zero current consumption. Prior art devices have not been able to provide such a voltage level shifter with these features.

BRIEF DESCRIPTION OF THE DRAWING(S)

The foregoing and a better understanding of the present invention will become apparent from the following detailed description of example embodiments and the claims when read in connection 5 with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Figure 1:
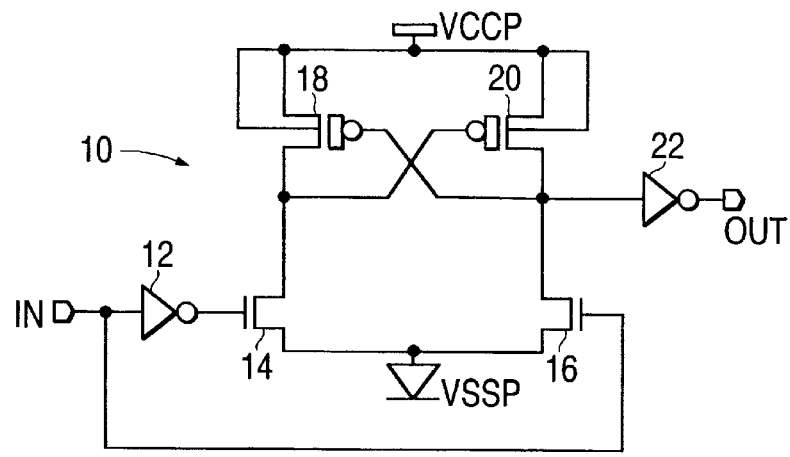
FIG. 1 is an example schematic diagram of an example level shifter having a disadvantageous arrangement.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Still further, the clock and timing signal FIGS. are not drawn to scale, and instead, exemplary and critical time values are mentioned when appropriate. With regard to description of any timing signals, the terms assertion and negation may be used in an intended generic sense. More particularly, such terms are used to avoid confusion when working with a mixture of "active-low" and "active-high" signals, and to represent the fact that the invention is not limited to the illustrated/described signals, but could be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

A traditional type level shifter 10 is shown in FIG. 1. It receives an input and shifts the signal so as to produce an output having the same binary value but at a different voltage level. Thus, the signal IN contains a digital bit from a device using a lower voltage level signal. This binary signal is inverted by inverter 12 and provided to the gate of MOSFET 14. The original signal at the same time is applied to the gate of MOSFET 16. The two gates operate in response to a voltage at this level. Thus, the signals applied to these two gates are complements of each other. Accordingly, normally one and only one of these two transistors is on at a given time. One side of each of these transistors is connected to VSSP, which is normally a zero voltage level, or ground. The transistor which is on thus connects the node to which it is attached on the other terminal to go to the zero voltage level. The nodes above these two switches are cross coupled to thick gate P-MOSFETs 18 and 20. This pair of transistors will also normally have one on and one off. Depending on which of the lower transistors is Ho conductive, one of the pair of transistors 18 and 20 will be connected to "0" voltage level VSSP and the other will be at the "1" voltage level VCCP. One of the nodes hence will be at a "0" and the other at a "1" level. Since inverter 22 is connected to one of these nodes, it also will be at one of the two levels and invert the bit to produce an output. Since the voltage VCCP is rated to the high voltage level system, the output signal will be at this voltage level. Accordingly, the output signal will be at a higher level, such as 3.3 volts for a "1" signal rather than a low voltage level, such as 1.1 volts like the input.

While this type of level shifter does serve a purpose in inverting from a lower voltage level to a higher one, it does not provide the requirements for operation in the drowsy mode. In the drowsy mode operation the standard VSS voltage which is usually zero volts may become greater than zero volts. This is because the voltage between the two levels is reduced for a drowsy mode of operation. Although VSS may rise above zero volts, the VSSSUP level remains at zero volts. VSSSUP is the voltage source which provides the bulk tie for all n-devices on the chips. Since VSS provides the source tie for such devices, and normally both are provided at the zero voltage level, there is normally a zero voltage difference between the source and bulk of the n-devices. This voltage between the source and bulk determines the threshold voltage of the MOSFET that is required in order to have the gate turn on. In normal operation this voltage threshold is very small because there is zero voltage between the source and bulk. However, when the transistor is off, there is some leakage current between the drain and source because of the small threshold. Accordingly, it is desirable to increase the threshold voltage when the device is not being used so as to reduce the leakage current One way of doing this is by increasing the voltage between the source and bulk and thus the threshold voltage.

The signals to be received at the gates of transistors 14 and 16 may during the drowsy mode operation have a voltage level greater than zero volts. That is, the digital "1" is normally considerably greater than zero volts and the digital "0" now may have a voltage level of VSS which may rise above zero volts. On the other hand, VSSP stays at zero volts. Since both transistors 14 and 16 can be biased on, they may be leaking DC current during the drowsy mode operation. It is therefore preferable to utilize a device which provides a level shifting operation in a similar fashion but without leaking current in the drowsy mode and while still retaining the digital bit values.

Figure 2:
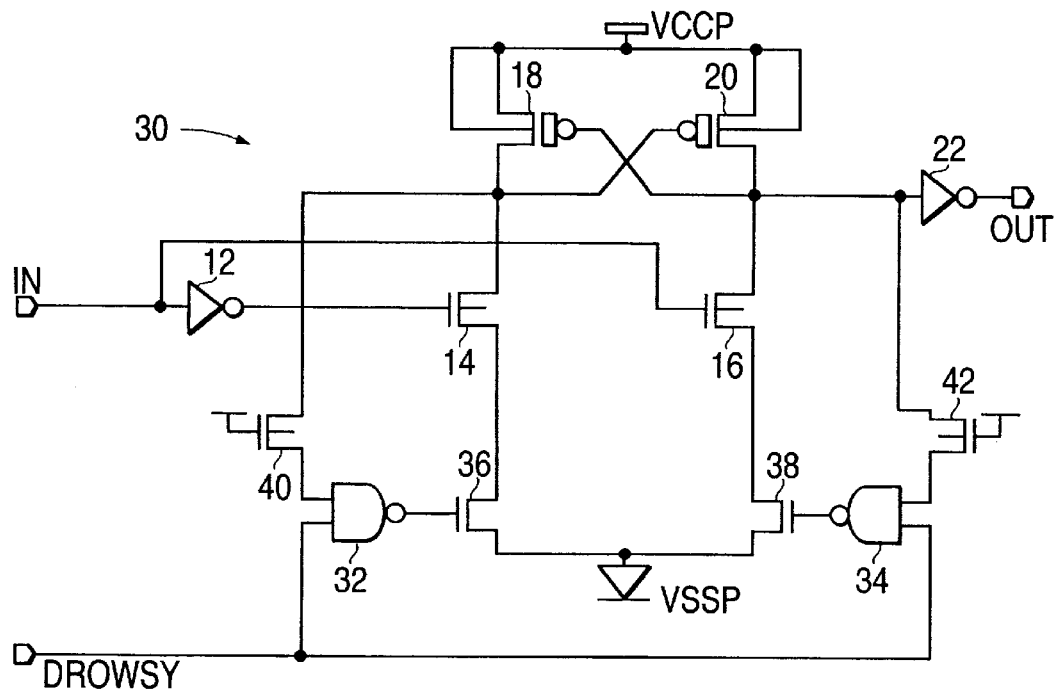
FIG. 2 is an example schematic diagram of an example level shifter having an advantageous arrangement of the present invention.

FIG. 2 shows an advantageous example of such a level shifter 30 having zero DC consumption during the drowsy mode operation. This device has similar input and output signals, with the input connected to inverter 12 and the two complimentary signals connected to the gates of transistors 14 and 16. These are also connected to transistors 18 and 20 and inverter output 22 in the same fashion as the device shown in FIG. 1. However, additional circuitry has been added to change the operation of the device during the drowsy mode.

An additional signal indicates when the drowsy mode occurs. This input is connected to one input of the two NAND gates 32 and 34. When the device is not in the drowsy mode, the drowsy signal is at a digital "0" which causes the NAND gates to provide a digital "1" signal to the gates of MOSFETS 36 and 38. These transistors then become conductive connecting transistors 14 and 16 to VSSP so that the operation of the level shifter resembles that of the one shown in FIG. 1.

However, when the drowsy mode operation occurs, the drowsy signal becomes a digital "1" so that NAND gates 32 and 34 receive a high bit value on one of its inputs. Since the gates of MOSFETs 40 and 42 are connected to a voltage source at 1.3 volts, for example MOSFETS 40 and 42 are normally conductive and connect the other input of the NAND gates to the two nodes between the other four transistors. Transistors 40 and 42 are vertical drain N-MOSFET devices which can tolerate 3.3 volts between the drain and gate and clamp the inputs to the NAND gates so that they do not go above VCC. Depending on the voltage levels of these two nodes, NAND gates 32 and 34 will produce digital "1's" or digital "0's" and turn transistors 36 and 38 on or off. Thus, if the voltage level at the node between transistors 14 and 18 is 3.3 volts and the voltage at the node between transistors 16 and 20 is zero volts, the output of NAND gate 32 will be digital "0" while the output of NAND gate 34 will be digital "1". Thus transistor 36 will be turned off shutting down the DC current path which would be open in the level shifter of FIG. 1. Transistor 38 will turn on causing the node between transistors 16 and 20 to be latched to zero volts and thus the other node to be latched to 3.3 volts. By latching the values of the shifter, any signals received at the input will be ignored and the existing state of the shifter will remain constant The NAND gates 32 and 34 are special in the sense that they are designed to operate off of VSSP rather than VSS, the standard source be for N-devices. Although the VSS and VCC voltage sources are not shown, they provide the voltage levels to the device providing the input to the voltage shifter. As an example, VSS can be zero volts, VCC can be 1.1 volts, VSSP can be 0 volts, and VCCP 3.3 volts. While the current voltage level sensor is shown as shifting up, these values can be reversed for a down shifting arrangement Other combinations of voltage levels can also be utilized. For example, VCC can be 0.7 volts, 1.1. volts or 1.3 volts.

Figure 5:
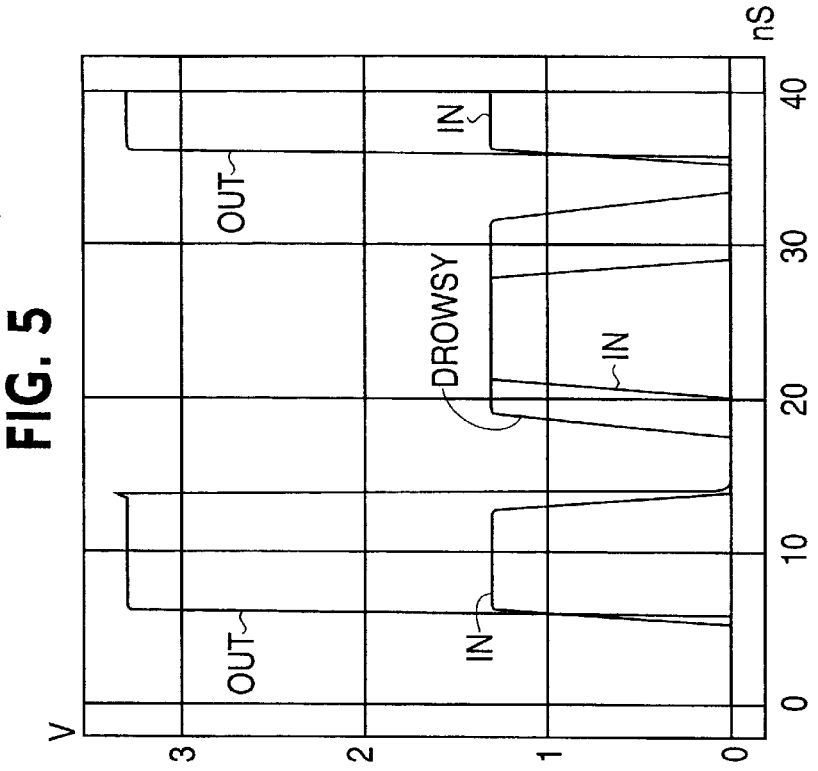
FIGS. 3 through 5 are graphs showing example voltage levels of an example voltage level shifter having an advantageous arrangement of the present invention.
Figure 3:
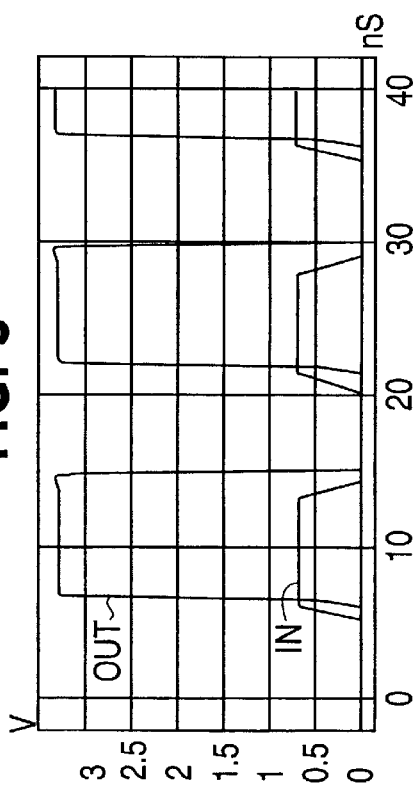
Figure 4:
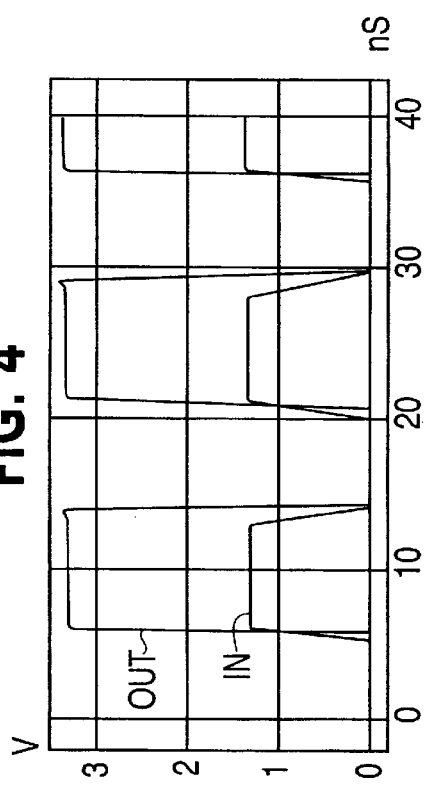

FIGS. 3 through 5 are graphs of voltages compared to times of the input and output signals applied to the voltage shifter. In FIG. 3, the input signal varies between 0 and 0.7 volts and the output signal varies between 0 and 3.3 volts. Thus, in this system VCC equals 0.7 volts and VCCP equals 3.3 volts. In FIG. 4, a similar arrangement is present, but the input signal has a high logic level of 1.3 volts instead of 0.7 volts. However, the input and output signals follow in the same fashion. In both FIGS. 3 and 4, the system is operating in normal mode.

FIG. 5 shows the arrangement where the system switches to drowsy mode. Thus, the first signal which occurs at about 5 nS has an input voltage of 1.3 and an output voltage of 3.3. However, the system enters the drowsy mode at 17 nS so that an input signal at 20 nS is ignored and the output remains at 0 volts. When the drowsy mode ends at 32 nS, the device returns to normal operation.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An apparatus for shifting a digital signal from a first voltage level to a second voltage level, comprising:
   an input for receiving a signal at said first voltage level;
   a conversion circuit for converting said first voltage level to said second voltage level;
   an output for sending out a signal at said second voltage level; and
   a current path removal circuit for preventing DC current from leaking from said conversion circuit and for retaining the state of said conversion circuit, wherein said current path removal circuit includes at least one gate for receiving a drowsy mode signal and at least one transistor for receiving an output of said at least one gate to shut off a current path from said conversion circuit.

2. The apparatus according to claim 1, wherein said current path removal circuit includes two gates and two transistors.

3. The apparatus according to claim 1, wherein one of said first and second voltage levels is 3.3 volts.

4. The apparatus according to claim 1, wherein one of said first and second voltage levels is 1.1 volts.

5. An apparatus for shifting a digital signal from a first voltage level to a second voltage level, comprising:
   an input for receiving a signal at said first voltage level;
   a conversion circuit for converting said first voltage level to said second voltage level;
   an output for sending out a signal at said second voltage level; and
   a current path removal circuit for preventing DC current from leaking from said conversion circuit and for retaining the state of said conversion circuit, wherein said conversion circuit includes first and second transistors having gates controlled by said input signal and an inverse of said input signal, respectively, one terminal of said first and second transistors being connected to a first voltage source, the remaining terminal of said first and second transistors being connected to terminals of third and fourth transistors, respectively and also gates of said fourth and said third transistors, respectively, said third and fourth transistors having another terminal connected to a second voltage source.

6. An apparatus for shifting a first voltage level to a second voltage level comprising:
   an input for receiving a signal at said first voltage level;
   means for converting said first voltage level to said second voltage level connected to said input;
   an output connected to said means for converting for sending out a signal at said second voltage level;
   means, including at least one gate, for determining a drowsy mode of operation; and
   switch means, controlled by said means for determining, for removing a current path from said means for converting and for retaining the state of said means for converting, wherein said switch means includes at least one transistor for receiving an output of said means for determining to shut off a current path from said means for converting.

7. The apparatus according to claim 6, wherein the means for switching includes two transistors.

8. The apparatus according to claim 6, wherein one of said first and second voltage levels is 3.3 volts.

9. The apparatus according to claim 6, wherein one of said first and second voltage levels is 1.1 volts.

10. An apparatus for shifting a first voltage level to a second voltage level comprising:
    an input for receiving a signal at said first voltage level;
    means for converting said first voltage level to said second voltage level connected to said input;
    an output connected to said means for converting for sending out a signal at said second voltage level;
    means for determining a drowsy mode of operation; and
    switch means, controlled by said means for determining for removing a current path from said means for converting and for retaining the state of said means for converting, wherein said means for converting includes two NAND gates.

11. A method for shifting a first voltage level to a second voltage level comprising:
    receiving a signal at said first voltage level;
    converting said first voltage level to said second voltage level using a conversion circuit;
    sending out a signal at a second voltage level;
    recognizing a drowsy mode of operation; and
    removing a DC current path in response to recognizing a drowsy mode to prevent current drain and, to retain existing voltage levels, and to prevent DC current from leaking from said conversion circuit and for retaining the state of said conversion circuit, wherein said removing includes operation of at least one gate for receiving a drowsy mode signal and at least one transistor for receiving an output of said at least one gate, to shut off a current path from said conversion circuit.

12. The method according to claim 11, wherein the current path is removed by turning off said at least one transistor.

13. The apparatus according to claim 11, wherein one of said first and second voltage levels is 3.3 volts.

14. The apparatus according to claim 11, wherein one of said first and second voltage levels is 1.1 volts.

* * * * *